(12) United States Patent
Lin et al.

(10) Patent No.: US 8,741,446 B2
(45) Date of Patent: Jun. 3, 2014

(54) ORGANIC COMPOUND AND ORGANIC ELECTROLUMINESCENT DEVICE EMPLOYING THE SAME

(75) Inventors: Jin-Sheng Lin, Tainan (TW); Meng-Ting Lee, Taipei (TW); Heh-Lung Huang, Taipei County (TW)

(73) Assignee: Industrial Technology Research Institute, Hsinchu County (TW)

( * ) Notice: Subject to any disclaimer, the term of this patent is extended or adjusted under 35 U.S.C. 154(b) by 132 days.

(21) Appl. No.: 12/975,339

(22) Filed: Dec. 21, 2010

(65) Prior Publication Data
US 2012/0098413 A1   Apr. 26, 2012

(30) Foreign Application Priority Data

Oct. 21, 2010   (TW) ................................ 99135901 A

(51) Int. Cl.
*H01L 51/54* (2006.01)

(52) U.S. Cl.
USPC ........... 428/690; 428/917; 313/504; 313/505; 313/506; 257/40; 257/E51.05; 257/E51.026; 257/E51.032; 564/26; 564/426; 564/434; 546/18; 546/79; 548/418; 548/440; 548/444

(58) Field of Classification Search
USPC .................. 428/690, 917; 313/504, 505, 506; 257/40, E51.05, E51.026, E51.032; 564/26, 426, 434; 546/18, 24, 79; 548/418, 440, 444
See application file for complete search history.

(56) References Cited

U.S. PATENT DOCUMENTS

| | | |
|---|---|---|
| 2005/0112765 A1 | 5/2005 | Li et al. |
| 2009/0167162 A1 | 7/2009 | Lin et al. |

FOREIGN PATENT DOCUMENTS

| | | |
|---|---|---|
| CN | 1583722 A | 2/2005 |
| CN | 101282931 A | 10/2008 |

(Continued)

OTHER PUBLICATIONS

Vaeth and Tang, Light -emitting diodes based on phosphorescent guest/ polymeric host systems, 2002, J of Applied Physics, vol. 92, No. 7, pp. 3447-3453.*

(Continued)

*Primary Examiner* — Gregory Clark
(74) *Attorney, Agent, or Firm* — Pai Patent & Trademark Law Firm; Chao-Chang David Pai

(57) ABSTRACT

Organic compounds and organic electroluminescent devices employing the same are provided. The organic compound has a chemical structure represented below:

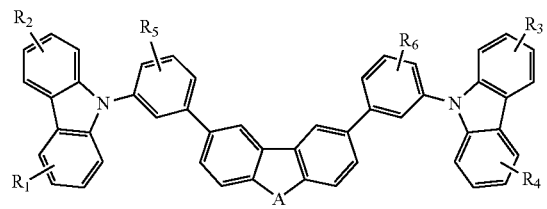

wherein, $R_1$, $R_2$, $R_3$, $R_4$, $R_5$, and $R_6$ are independent and can be H, $C_{1-8}$ alkyl, $C_{1-8}$ alkoxy, $C_{1-8}$ halo-alkyl, aryl, heteroaryl, cycloalkyl, hetero-cycloalkyl, or cycloaliphatic group, and A is S, or

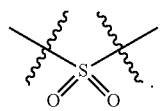

10 Claims, 1 Drawing Sheet

(56) References Cited

FOREIGN PATENT DOCUMENTS

| | | | | |
|---|---|---|---|---|
| CN | 101687837 A | | 3/2010 | |
| JP | 2005-112765 | * | 4/2005 | ............ C07D 307/91 |
| JP | 2005-112765 A | | 4/2005 | |
| JP | 2009-035524 A | | 2/2009 | |
| JP | 2009-215333 A | | 9/2009 | |
| JP | 2009-263579 | * | 11/2009 | ............ C09K 11/06 |
| JP | 2010-135467 | * | 6/2010 | ............ H01L 51/50 |

OTHER PUBLICATIONS

Huang et al., "Dibenzothiophene/Oxide and Quinoxaline/Pyrazine Derivatives Serving as Electron-Transport Materials", Adv. Funct. Mater. 2006, 16, 1449-1456, WILEY-VCH Verlag GmbH & Co. KGaA, Weinheim.

Huang et al., "Dipolar Dibenzothiophene S,S-Dioxide Derivatives Containing Diarylamine: Materials for Single-Layer Organic Light-Emitting Devices", Adv. Mater. 2006, 18, 602-606, WILEY-VCH Verlag GmbH & Co. KGaA, Weinheim.

Huang et al., "Organic electroluminescent derivatives containing dibenzothiophene and diarylamine segments", J Mater. Chem., 2005, 15, 3233-3240, The Royal Society of Chemistry.

Office Action (Notification of Examination Opinion) issued by China's State Intellectual Property Office on Sep. 18, 2013, for the above-referenced application's counterpart application in China (Application No. 201110174582.1).

Office Action (Notification of Examination Opinion) issued by the Taiwan Intellectual Property Office on Aug. 14, 2013, for the above-referenced application's counterpart application in Taiwan (Application No. 099135901).

* cited by examiner

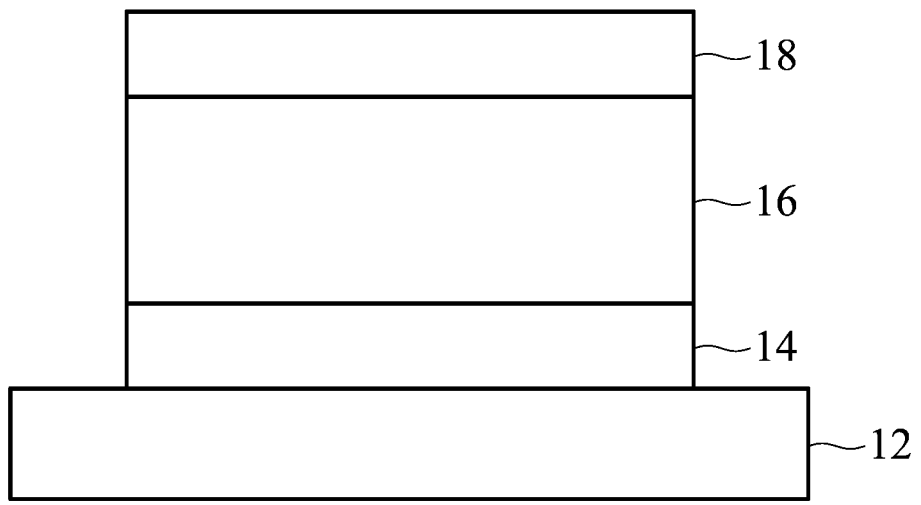

ORGANIC COMPOUND AND ORGANIC ELECTROLUMINESCENT DEVICE EMPLOYING THE SAME

CROSS REFERENCE TO RELATED APPLICATIONS

This application is based upon and claims the benefit of priority from the prior Taiwan Patent Application No. 099135901, filed on Oct. 21, 2010, the entire contents of which are incorporated herein by reference.

BACKGROUND OF THE INVENTION

1. Field of the Invention

The disclosure relates to an organic compound and organic electroluminescent device employing the same and, more particularly, to an organic compound serving as a host material and a phosphorescent organic electroluminescent device employing the same.

2. Description of the Related Art

Recently, with the development and wide application of electronic products, such as mobile phones, PDAs, and notebook computers, there have been increasing demand for flat display elements which consume less electric power and occupy less space. Organic electroluminescent devices are self-emitting and highly luminous, with wide viewing angles, fast response speeds, and simple fabrication methods, making them an industry display of choice.

Generally, an organic electroluminescent device is composed of a light-emission layer sandwiched between a pair of electrodes. When an electric field is applied to the electrodes, the cathode injects electrons into the light-emission layer and the anode injects holes into the light-emission layer. When the electrons recombine with the holes in the light-emission layer, excitons are formed. Recombination of the electron and the hole results in light emission.

Depending on the spin states of the hole and electron, the exciton which results from the recombination of the hole and electron can have either a triplet or singlet spin state. Luminescence from a singlet exciton results in fluorescence light whereas luminescence from a triplet exciton results in phosphorescence light. The emissive efficiency of phosphorescence light is three times that of fluorescence light. Therefore, it is crucial to develop highly efficient phosphorescent material, in order to increase the emissive efficiency of the OLED.

In the application of organic electroluminescent devices, phosphorescent guest materials have to be used in combination with host materials which have a matching energy gap therewith, to achieve optimal electroluminescent performance and quantum yield. Particularly, since blue and green host materials require large energy gap differences between the host and guest material for electroluminescence, the host materials used in a phosphorescent OLED should have a short conjugated system. Further, in order to keep the key characteristics of the organic compound used in the OLED (i.e. thermal-stability), the host material should also have a large molecular weight, which results in difficulty for chemical structure design.

Certain organic compounds have been disclosed, using blue phosphorescent OLEDs, such as US Patent 2005112765 and JP Patent 2009035524. Most of the disclosed organic compounds have moieties of carbazole or silyl benzene derivatives. However, the aforementioned compounds exhibit inferior thermal-stability or results in low current density of the OLED device.

Therefore, it is necessary to develop novel organic compounds suitable for phosphorescent OLEDs to solve the above problems.

BRIEF SUMMARY OF THE INVENTION

An exemplary embodiment of an organic compound has a Formula (I), of:

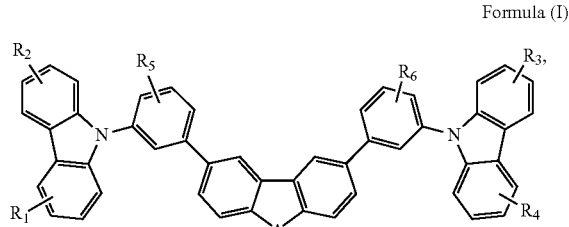

Formula (I)

wherein $R_1$, $R_2$, $R_3$, $R_4$, $R_5$, and $R_6$ are each independently an H, $C_{1-8}$ alkyl group, $C_{1-8}$ alkoxy group, $C_{1-8}$ halo-alkyl group, aryl group, heteroaryl group, cycloalkyl group, heterocycloalkyl group, or cycloaliphatic group, and A is S, or

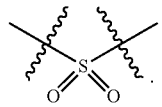 [SMILES: *S(*)(=O)=O]

In another exemplary embodiment of the disclosure, an organic electroluminescent device is provided. The device includes a pair of electrodes and an electroluminescent element disposed between the pair of electrodes, wherein the electroluminescent element includes the aforementioned organic compound.

Yet another exemplary embodiment of the disclosure provides an organic electroluminescent device including an emission layer which includes a host material and a phosphorescent dopant. Particularly, the host material includes the aforementioned organic compound and the emission layer emits blue light under a bias voltage.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein:

FIG. 1 shows a cross section of an organic electroluminescent device disclosed by an embodiment of the disclosure.

DETAILED DESCRIPTION OF THE INVENTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

Organic Compound

The disclosure provides an organic compound having a structure represented by Formula (I)

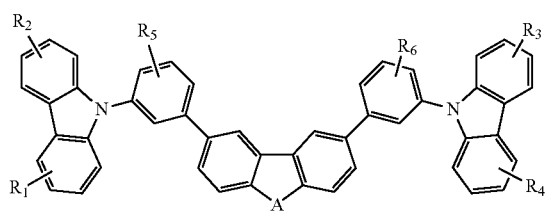

Formula (I)

wherein $R_1$, $R_2$, $R_3$, $R_4$, $R_5$, and $R_6$ are each independently an H, $C_{1-8}$ alkyl group, $C_{1-8}$ alkoxy group, $C_{1-8}$ halo-alkyl group, aryl group, heteroaryl group, cycloalkyl group, heterocycloalkyl group, or cycloaliphatic group, and A is S, or

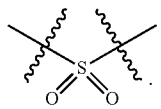 [SMILES: *S(*)(=O)=O]

In the structure of Formula (I), the moieties

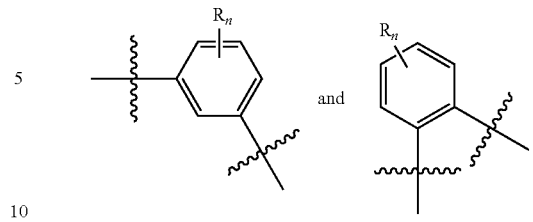

and (n=1, 2, 3, 4, 5, or 6) means that all four substitutable functional groups of the benzene ring can be $R_n$, and the four $R_n$ are independent. For example, $R_1$, $R_2$, $R_3$, $R_4$, $R_5$, and $R_6$ can be each independently a methyl group, ethyl group, propyl group, isopropyl group, butyl group, tert-butyl group, methoxy group, ethoxy group, propoxy group, isopropoxy group, butoxy group, or isobutoxy group. Further, $R_1$, $R_2$, $R_3$, $R_4$, $R_5$, and $R_6$ can be each independently a phenyl group, biphenyl group, pyridyl group, furyl group, naphthyl group, anthryl group, phenanthrenyl group, imidazolyl group, pyrimidinyl group, quinolinyl group, indolyl group, or thiazolyl group.

It should be noted that the organic compounds of the disclosure have high triplet energy gap ($T_1$) and are apt to transmit energy to a guest emitter. Therefore, the organic compounds of Formula (I) of the disclosure are suitable for serving as a host material of the blue phosphorescent organic electroluminescent devices, thereby increasing the efficiency thereof.

The organic compounds according to Formula (I) of the disclosure include the following compounds shown in Table 1. In addition, the contraction thereof are also named and shown in Table 1.

TABLE 1

| Example | structure | contraction |
|---------|-----------|-------------|
| 1 | | CzDBS |
| 2 | | CzDBSO |

TABLE 1-continued

| Example | structure | contraction |
|---------|-----------|-------------|
| 3 | | tBCzDBS |
| 4 | | tBCzDBSO |

In order to clearly illustrate the method for preparing organic compounds according to Formula (I), the preparation of compounds disclosed in Examples 1, and 2 are described in detail as below.

Example 1

Preparation of Compound CzDBS 10.0 g of dibenzothiophene and 100 ml of dichloromethane were added into a 250 ml bottle. Next, 2.2 eq of bromine water was added dropwisely into the bottle at 0° C. After, the mixture was stirred at room temperature for 24 hr, a compound (I) was obtained.

The synthesis pathway was as follows:

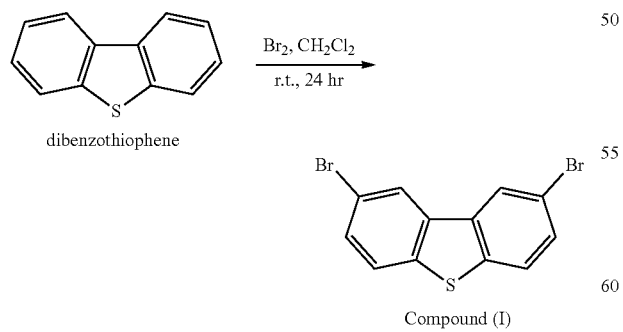

Compound (I)

Next, 16.7 g of carbazole and 34.0 g of bromoiodobenzen were added into a 250 ml bottle and dissolved into 150 ml dehydrated dimethylformamide. Next, 0.65 g of copper and 13.8 g of potassium carbonate were added into the bottle and heated to 130° C. After reacting for 24 hrs and purification by column chromatography, a colorless solid compound (II) was obtained.

The synthesis pathway was as follows:

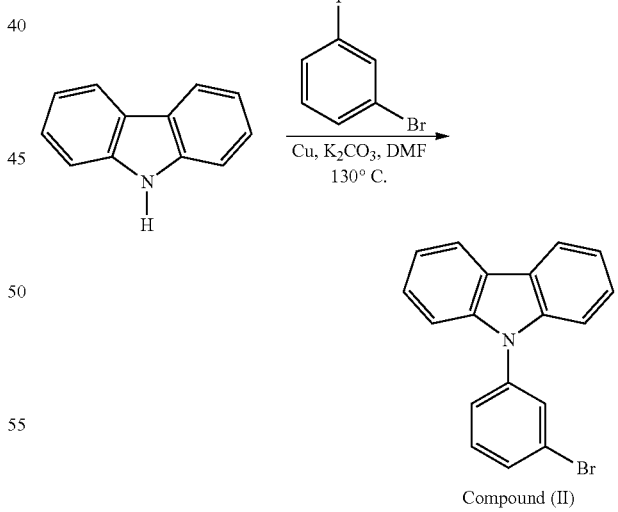

Compound (II)

Next, 6.4 g of compound (II) was added into a 100 ml bottle and dissolved into 120 ml dehydrated tetrahydrofuran. After cooling to −78° C., n-BuLi (22.0 mmole, 13.8 ml (1.6M in hexane)) was slowly added into the bottle. After stirring for 1 hr, 4.5 g of compound (III) was added into the bottle. After reacting at room temperature for 2 hrs, a white powdered compound (IV) was obtained.

The synthesis pathway was as follows:

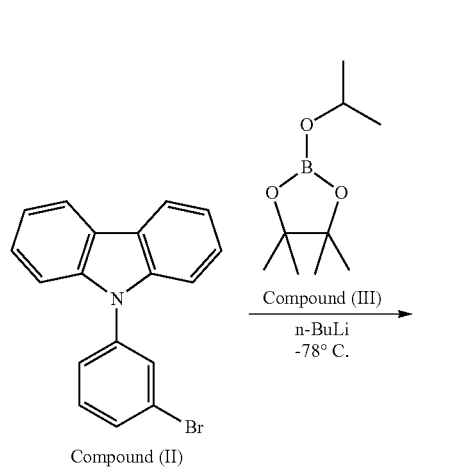

Next, 6.8 g of compound (I), 15.4 g of compound (IV), 1.2 g of Pd(PPh3)4 (serving as catalyst), and 5.5 g of potassium carbonate were added into a bottle, and dissolved into 100 ml of dimethyl ether and 50 ml of water. After refluxing for 12 hr, the result was cooled to room temperature and subjected to a purification (twice sublimation processes), obtaining a compound CzDBS.

The synthesis pathway was as follows:

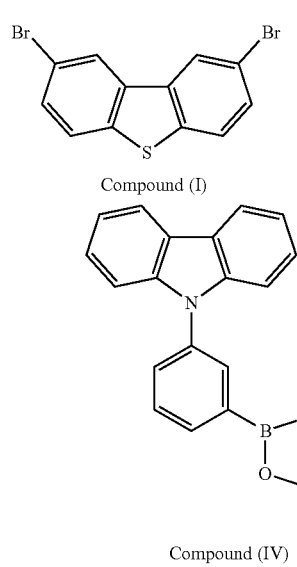

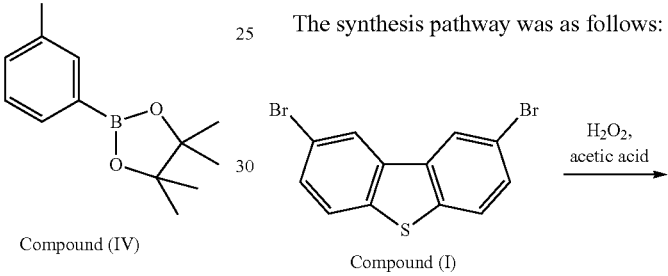

CzDBS

Example 2

Preparation of Compound CzDBSO 6.8 g of compound (I) was added into a 250 ml bottle, and dissolved in 80 ml of acetic acid. After stirring, 10 ml of hydrogen peroxide was added dropwisely into the bottle, and heated to 100° C. for 2 hrs. After filtration, a compound DBSO was obtained.

The synthesis pathway was as follows:

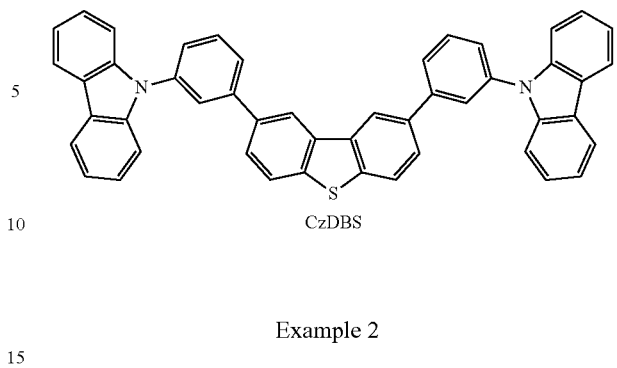

Next, 7.5 g of compound (V), 15.4 g of compound (IV), 1.2 g of Pd(PPh3)4 (serving as catalyst), and 5.5 g of potassium carbonate were added into a bottle, and then dissolved in 100 ml of dimethyl ether and 50 ml of water. After refluxing for 12 hrs, the result was cooled to room temperature and subjected to a purification (twice sublimation processes), obtaining a compound CzDBSO.

The synthesis pathway was as follows:

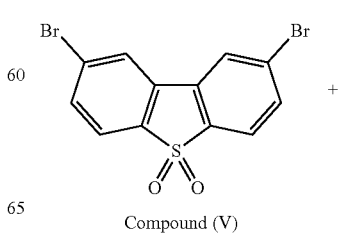

Compound (V)

-continued

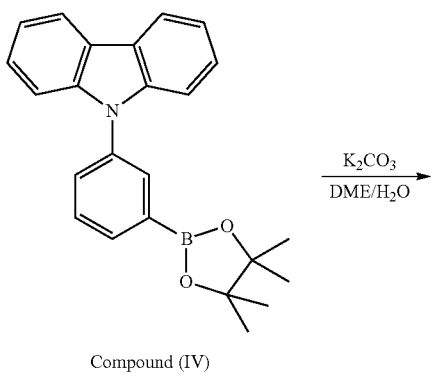

Compound (IV)

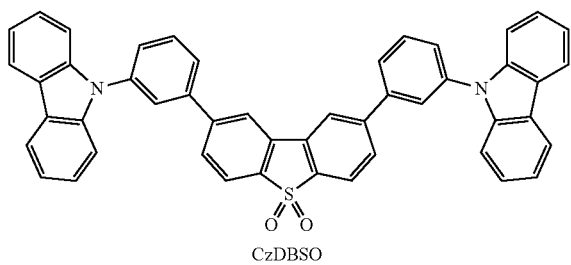

CzDBSO

Properties of Compounds CzDBS and CzDBSO

The glass transition temperature (Tg), HOMO (highest occupied molecular orbital) and LUMO (lowest unoccupied molecular orbital) energy gap, decomposition temperature (Td), and triplet energy gap ($T_1$) of compounds CzDBS, and CzDBSO were measured and are shown in Table 2

TABLE 2

| compound | Eg (eV) | LUMO (eV) | HOMO (eV) | $T_1$ (eV) | Tg (° C.) | Td (° C.) |
|---|---|---|---|---|---|---|
| CzDBS | 3.38 | 6.06 | 2.68 | 2.75 | 132.6 | 380.3 |
| CzDBSO | 3.40 | 6.10 | 2.70 | 2.72 | 143.5 | 375.2 |
| Comparative Example 1 | 3.34 | 6.02 | 2.68 | 2.64 | 151.2 | 388.0 |

As shown in Table 2, since the compounds CzDBS and CzDBSO have decomposition temperatures (Td) of more than 370° C., and glass transition temperature (Tg) of more than 130° C., the compounds of the disclosure exhibits excellent thermal stability. The compounds CzDBS and CzDBSO also have suitable LUMO and HOMO energy gaps, thereby substantially matching a normal electron transfer layer (with a LUMO energy gap of 2.70 eV). Since the difference between the HOMO energy gaps of the compounds CzDBS and CzDBSO and the LUMO energy gap of the normal electron transfer layer is not more than 0.02 eV, the electrons of the normal electron transfer layer are apt to be injected into the compounds CzDBS and CzDBSO.

Further, in comparison with the compound of Comparative Example 1 (having a structure represented by

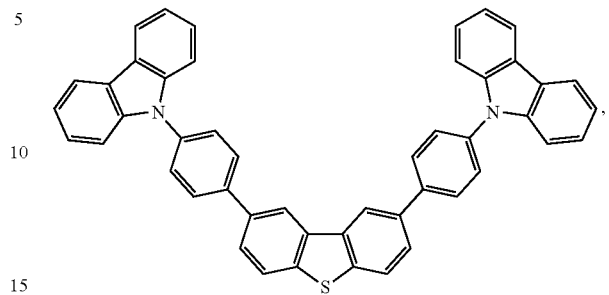

the carbazole moiety and thiophene moiety are bonded to the benzene ring in the para-position, such that the compounds CzDBS and CzDBSO (the carbazole moiety and thiophene moiety are bonded to the benzene ring in the meta-position) have improved energy gap (Eg) and triplet energy gap ($T_1$), thereby being suitable for blue organic electroluminescent device.

Organic Electroluminescent Device

FIG. 1 shows an embodiment of an organic electroluminescent device 10. The electroluminescent device 100 includes a substrate 12, a bottom electrode 14, an electroluminescent element 16, and a top electrode 18, as shown in FIG. 1. The organic electroluminescent device can be top-emission, bottom-emission, or dual-emission devices.

The substrate 12 can be a glass plastic, or semiconductor substrate. Suitable material for the bottom and top electrodes can be Ca, Ag, Mg, Al, Li, In, Au, Ni, W, Pt, Cu, indium tin oxide (ITO), indium zinc oxide (IZO), aluminum zinc oxide (AZO), or zinc oxide (ZnO), formed by sputtering, electron beam evaporation, thermal evaporation, or chemical vapor deposition. Further, al least one of the bottom and top electrodes 14 and 18 is transparent.

The electroluminescent element 16 at least includes an emission layer, and can further include a hole injection layer, a hole transport layer, an electron transport layer, and an electron injection layer. In an embodiment of the disclosure, at least one layer of the electroluminescent element 16 includes the aforementioned organic compound.

According to an embodiment of the disclosure, the organic electroluminescent device can be a phosphorescent organic electroluminescent device, and the phosphorescent organic electroluminescent device can include an emission layer including a host material and a phosphorescent dopant, wherein the host material includes the aforementioned organic compounds.

In order to clearly disclose the organic electroluminescent devices of the disclosure, the following examples (using CzDBS and CzDBSO as a host material and blue phosphorescent dopant) and comparative examples are intended to illustrate the disclosure more fully without limiting their scope, since numerous modifications and variations will be apparent to those skilled in this art.

Example 5

A glass substrate with an indium tin oxide (ITO) film of 100 nm was provided and then washed with a cleaning agent, acetone, and isopropanol with ultrasonic agitation. After drying with nitrogen flow, the ITO film was subjected to a UV/ozone treatment. Next, NPB (N,N'-di(naphthalene-1-yl)-

N,N'-diphenyl-benzidine, with a thickness of 30 nm), mCP (N,N'-dicarbazolyl-3,5-dibenzene, with a thickness of 10 nm), CzDBS doped with Firpic (Iridium-bis(4,6-difluorophenyl-pyridinato-N,C2)-picolinate) (the ratio between CzDBS and Firpic was 100:8, with a thickness of 30 nm), with a thickness of 30 nm), BPhen (4,7-diphenyl-1,10-phenanthroline), with a thickness of 30 nm), LiF (with a thickness of 0.5 nm), and Al (with a thickness of 120 nm) were subsequently formed on the ITO film at 10-5 Pa, obtaining the electroluminescent device (1). The materials and layers formed therefrom are described in the following.

ITO/NPB/mCP/CzDBS:FIrpic(8%)/BPhen/LiF/Al

The optical property of the electroluminescent device (1), as described in Example 5, was measured by a PR650 (purchased from Photo Research Inc.) and a Minolta TS110. The result is shown in Table 3.

Example 6

A glass substrate with an indium tin oxide (ITO) film of 100 nm was provided and then washed with a cleaning agent, acetone, and isopropanol with ultrasonic agitation. After drying with nitrogen flow, the ITO film was subjected to a UV/ozone treatment. Next, NPB (N,N'-di(naphthalene-1-yl)-N,N'-diphenyl-benzidine, with a thickness of 30 nm), mCP (N,N'-dicarbazolyl-3,5-dibenzene, with a thickness of 10 nm), CzDBSO doped with Firpic (Iridium-bis(4,6-difluorophenyl-pyridinato-N,C2)-picolinate) (the ratio between CzDBSO and Firpic was 100:8, with a thickness of 30 nm), with a thickness of 30 nm), BPhen (4,7-diphenyl-1,10-phenanthroline), with a thickness of 30 nm), LiF (with a thickness of 0.5 nm), and Al (with a thickness of 120 nm) were subsequently formed on the ITO film at 10-5 Pa, obtaining the electroluminescent device (2). The materials and layers formed therefrom are described in the following.

ITO/NPB/mCP/CzDBSO:FIrpic(8%)/BPhen/LiF/Al

The optical property of the electroluminescent device (2), as described in Example 5, was measured by a PR650 (purchased from Photo Research Inc.) and a Minolta TS110. The result is shown in Table 3.

Comparative Example 2

A glass substrate with an indium tin oxide (ITO) film of 100 nm was provided and then washed with a cleaning agent, acetone, and isopropanol with ultrasonic agitation. After drying with nitrogen flow, the ITO film was subjected to a UV/ozone treatment. Next, NPB (N,N'-di(naphthalene-1-yl)-N,N'-diphenyl-benzidine, with a thickness of 30 nm), mCP (N,N'-dicarbazolyl-3,5-dibenzene, with a thickness of 10 nm), compound of Comparative Example 1 (having the structure of

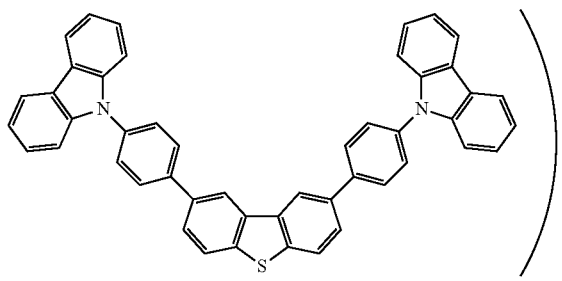

doped with Firpic (Iridium-bis(4,6-difluorophenyl-pyridinato-N,C2)-picolinate) (the ratio between compound of Comparative Example 1 and Firpic was 100:8, with a thickness of 30 nm), with a thickness of 30 nm), BPhen (4,7-diphenyl-1,10-phenanthroline), with a thickness of 30 nm), LiF (with a thickness of 0.5 nm), and Al (with a thickness of 120 nm) were subsequently formed on the ITO film at 10-5 Pa, obtaining the electroluminescent device (3). The materials and layers formed therefrom are described in the following.

ITO/NPB/mCP/compound of Comparative Example 1:FIrpic(8%)/BPhen/LiF/Al

The optical property of the electroluminescent device (3), as described in Example 5, was measured by a PR650 (purchased from Photo Research Inc.) and a Minolta TS110. The result is shown in Table 3.

TABLE 3

| No. | voltage (V) | current efficiency (cd/A) | power efficiency (lm/W) | CIE (X, Y) |
|---|---|---|---|---|
| | measured at a brightness of 1000 Cd/m2 | | | |
| electroluminescent device (1) | 6.9 | 21.0 | 9.6 | (0.17, 0.40) |
| electroluminescent device (2) | 7.3 | 17.2 | 7.4 | (0.17, 0.39) |
| electroluminescent device (3) | 7.6 | 12.6 | 5.2 | (0.18, 0.39) |

As shown in Table 3, with the premise that the same blue dopant was used, the organic compounds CzDBS and CzDBSO of the disclosure showed superior efficiency (promotion of 4.6-8.4 Cd/A and 2.2-4.4 lm/W) and reduced voltage in comparison with the compound of Comparative Example 1.

Example 7 shows an optimized electroluminescent device with CzDBS serving as a host material.

Example 7

A glass substrate with an indium tin oxide (ITO) film of 100 nm was provided and then washed with a cleaning agent, acetone, and isopropanol with ultrasonic agitation. After drying with nitrogen flow, the ITO film was subjected to a UV/ozone treatment. Next, TAPC (1,1-bis(di-4-tolylaminophenyl)cyclohexane, with a thickness of 30 nm), CzDBS doped with Firpic (Iridium-bis(4,6-difluorophenyl-pyridinato-N,C2)-picolinate) (the ratio between CzDBS and Firpic was 100:8, with a thickness of 30 nm), with a thickness of 30 nm), TmPyPB (1,3,5-tri(p-pyrid-3-yl-phenyl)benzene, with a thickness of 30 nm), LiF (with a thickness of 0.5 nm), and Al (with a thickness of 120 nm) were subsequently formed on the ITO film at 10-5 Pa, obtaining the electroluminescent device (4). The materials and layers formed therefrom are described in the following.

ITO/TAPC/CzDBS:Firpic(8%)/TmPyPB/LiF/Al

The optical property of the electroluminescent device (4), as described in Example 5, was measured by a PR650 (purchased from Photo Research Inc.) and a Minolta TS110. The result is shown in Table 4.

TABLE 4

| No. | voltage (V) | current efficiency (cd/A) | power efficiency (lm/W) | CIE (X, Y) |
|---|---|---|---|---|
| | measured at a brightness of 1000 Cd/m² | | | |
| electroluminescent device (4) | 3.8 | 33.8 | 28.0 | (0.17, 0.41) |

As shown in Table 4, the optimized electroluminescent device (4) employing the compound CzDBS serving as a host material of the disclosure showed superior efficiency (28 μm/W) in comparison with the conventional organic host material.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An organic compound having a Formula (I) of:

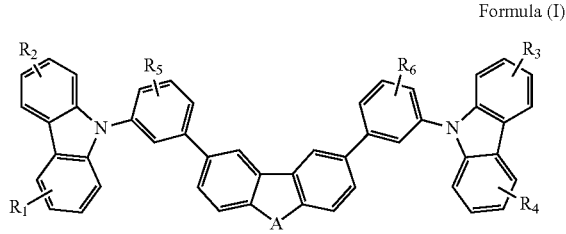

Formula (I)

wherein $R_1$, $R_2$, $R_3$, $R_4$, $R_5$, and $R_6$ are each independently an H, $C_{1-8}$ alkyl group, $C_{1-8}$ alkoxy group, $C_{1-8}$ haloalkyl group, aryl group, heteroaryl group, cycloalkyl group, hetero-cycloalkyl group, or cycloaliphatic group, and A is

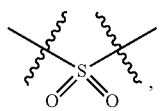 [SMILES: *S(*)(=O)=O]

wherein the heteroaryl group is pyridyl group, furyl group, imidazolyl group, pyrimidinyl group, quinolinyl group, indolyl group, or thiazolyl group; and the aryl group is phenyl group, biphenyl group, naphthyl group, anthryl group, or phenanthrenyl group.

2. The organic compound as claimed in claim 1, wherein $R_1$, $R_2$, $R_3$, $R_4$, $R_5$, and $R_6$ are each independently a methyl group, ethyl group, propyl group, isopropyl group, butyl group, tert-butyl group, methoxy group, ethoxy group, propoxy group, isopropoxy group, butoxy group, or isobutoxy group.

3. The organic compound as claimed in claim 1, wherein $R_1$, $R_2$, $R_3$, $R_4$, $R_5$, and $R_6$ are each independently a phenyl group, biphenyl group, pyridyl group, furyl group, naphthyl group, anthryl group, phenanthrenyl group, imidazolyl group, pyrimidinyl group, quinolinyl group, indolyl group, or thiazolyl group.

4. An organic electroluminescent device, comprising:
a pair of electrodes; and
an electroluminescent element disposed between the pair of electrodes, wherein the electroluminescent element comprises the organic compound having a Formula (I) of:

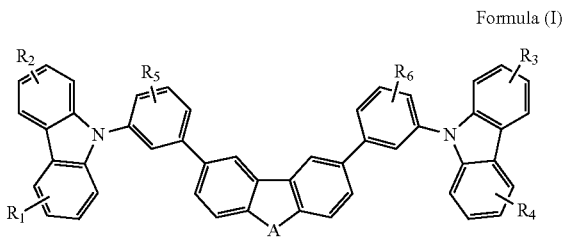

Formula (I)

wherein $R_1$, $R_2$, $R_3$, $R_4$, $R_5$, and $R_6$ are each independently an H, $C_{1-8}$ alkyl group, $C_{1-8}$ alkoxy group, $C_{1-8}$ haloalkyl group, aryl group, heteroaryl group, cycloalkyl group, hetero-cycloalkyl group, or cycloaliphatic group, and A is

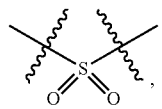 [SMILES: *S(*)(=O)=O]

wherein the heteroaryl group is pyridyl group, furyl group, imidazolyl group, pyrimidinyl group, quinolinyl group, indolyl group, or thiazolyl group; and the aryl group is phenyl group, biphenyl group, naphthyl group, anthryl group, or phenanthrenyl group.

5. The device as claimed in claim 4, wherein $R_1$, $R_2$, $R_3$, $R_4$, $R_5$, and $R_6$ are each independently a methyl group, ethyl group, propyl group, isopropyl group, butyl group, tert-butyl group, methoxy group, ethoxy group, propoxy group, isopropoxy group, butoxy group, or isobutoxy group.

6. The device as claimed in claim 4, wherein $R_1$, $R_2$, $R_3$, $R_4$, $R_5$, and $R_6$ are each independently a phenyl group, biphenyl group, pyridyl group, furyl group, naphthyl group, anthryl group, phenanthrenyl group, imidazolyl group, pyrimidinyl group, quinolinyl group, indolyl group, or thiazolyl group.

7. An organic electroluminescent device, comprising:
a pair of electrodes; and
an electroluminescent element disposed between the pair of electrodes, wherein the electroluminescent element comprises an emission layer comprising a host material and a phosphorescent dopant, and the host material comprises an organic compound having a Formula (I) of:

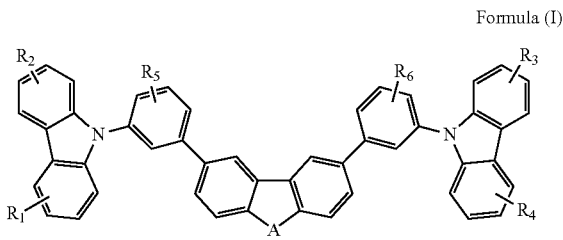

Formula (I)

wherein $R_1$, $R_2$, $R_3$, $R_4$, $R_5$, and $R_6$ are each independently an H, $C_{1-8}$ alkyl group, $C_{1-8}$ alkoxy group, $C_{1-8}$ haloalkyl group, aryl group, heteroaryl group, cycloalkyl group, hetero-cycloalkyl group, or cycloaliphatic group, and A is

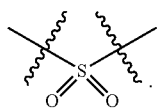 [SMILES: *S(*)(=O)=O]

8. The organic electroluminescent device as claimed in claim 7, wherein $R_1$, $R_2$, $R_3$, $R_4$, $R_5$, and $R_6$ are each independently a methyl group, ethyl group, propyl group, isopropyl group, butyl group, tert-butyl group, methoxy group, ethoxy group, propoxy group, isopropoxy group, butoxy group, or isobutoxy group.

9. The organic electroluminescent device as claimed in claim 7, wherein $R_1$, $R_2$, $R_3$, $R_4$, $R_5$, and $R_6$ are each independently a phenyl group, biphenyl group, pyridyl group, furyl group, naphthyl group, anthryl group, phenanthrenyl group, imidazolyl group, pyrimidinyl group, quinolinyl group, indolyl group, or thiazolyl group.

10. The organic electroluminescent device as claimed in claim 7, wherein the emission layer emits blue light under a bias voltage.

* * * * *